(12) United States Patent
Ellis et al.

(10) Patent No.: US 8,099,688 B2
(45) Date of Patent: *Jan. 17, 2012

(54) CIRCUIT DESIGN

(75) Inventors: Wayne F. Ellis, Jericho, VT (US);
Randy W. Mann, Burlington, NC (US);
David J. Wager, Jericho, VT (US);
Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 500 days.

This patent is subject to a terminal disclaimer.

(21) Appl. No.: 11/985,961

(22) Filed: Nov. 19, 2007

(65) Prior Publication Data

US 2009/0129191 A1    May 21, 2009

(51) Int. Cl.
*G06F 17/50* (2006.01)
(52) U.S. Cl. ....................................................... 716/100
(58) Field of Classification Search ................ 716/1, 10, 716/100
See application file for complete search history.

(56) References Cited

U.S. PATENT DOCUMENTS

| | | | |
|---|---|---|---|
| 5,715,191 A | 2/1998 | Yamauchi et al. | |
| 5,757,702 A | 5/1998 | Iwata et al. | |
| 6,205,049 B1 | 3/2001 | Lien et al. | |
| 6,549,453 B2 | 4/2003 | Wong | |
| 6,654,277 B1 | 11/2003 | Hsu et al. | |
| 6,795,332 B2 | 9/2004 | Yamaoka et al. | |
| 6,836,877 B1 * | 12/2004 | Dupenloup | 716/103 |
| 6,925,025 B2 | 8/2005 | Deng et al. | |
| 6,990,035 B2 | 1/2006 | Redwine et al. | |
| 7,023,722 B2 | 4/2006 | Kanehara et al. | |
| 7,055,007 B2 | 5/2006 | Flautner et al. | |

(Continued)

OTHER PUBLICATIONS

K. Zhang et al., "A 3-GHz 70 Mb SRAM in 65 nm CMOS Technology with Integrated Column-Based Dynamic Power Supply," *2005 IEEE International Solid-State Circuits Conference*, IEEE, pp. 474-475, 611 (Feb. 9, 2005).

*Primary Examiner* — Suchin Parihar
(74) *Attorney, Agent, or Firm* — Joseph P. Abate; Howard M. Cohn

(57) ABSTRACT

A design process includes inputting a design file representing a circuit design embodied in a non-transitory computer-readable medium, and using a computer to translate the circuit design into a netlist. The netlist comprises a representation of a plurality of wires, transistors, and logic gates, and is stored in the non-transitory computer-readable medium. When executed by the computer, the netlist produces the circuit design. The circuit design comprises a static random access memory ("SRAM") including a plurality of SRAM cells arranged in an array, including a plurality of rows and a plurality of columns, and a plurality of column voltage control circuits corresponding to respective ones of the plurality of columns of the array. Each of the plurality of voltage control circuits is coupled to an output of a power supply and is operable to temporarily reduce a voltage upon arrival of a bit select signal provided to power supply inputs of a plurality of SRAM cells belonging to a selected column of the plurality of columns. The selected column is selected during a write operation in which a bit is written to one of the plurality of SRAM cells belonging to the selected column. Each column voltage control circuit includes an NFET and a pair of PFETs. Each NFET and pair of PFETs has a conduction path directly connected between the output of the power supply and the power supply inputs of the plurality of SRAM cells.

2 Claims, 5 Drawing Sheets

U.S. PATENT DOCUMENTS

| | | | |
|---|---|---|---|
| 7,313,032 B2* | 12/2007 | Ellis et al. | 365/189.09 |
| 2003/0147272 A1* | 8/2003 | Joshi et al. | 365/156 |
| 2005/0068824 A1 | 3/2005 | Houmura et al. | |
| 2007/0121370 A1* | 5/2007 | Ellis et al. | 365/154 |
| 2008/0089116 A1* | 4/2008 | Ellis et al. | 365/156 |
| 2008/0117692 A1* | 5/2008 | Yamaoka et al. | 365/189.09 |
| 2008/0279017 A1* | 11/2008 | Shimano et al. | 365/189.06 |
| 2009/0059705 A1* | 3/2009 | Wong | 365/226 |
| 2009/0059706 A1* | 3/2009 | Wong | 365/226 |
| 2009/0109733 A1* | 4/2009 | Wong | 365/154 |
| 2009/0109764 A1* | 4/2009 | Houston | 365/189.09 |
| 2009/0132873 A1* | 5/2009 | Joshi et al. | 714/711 |
| 2009/0141569 A1* | 6/2009 | Nii et al. | 365/189.16 |
| 2009/0172451 A1* | 7/2009 | Joshi et al. | 713/324 |

\* cited by examiner

CIRCUIT DESIGN

BACKGROUND OF THE INVENTION

An important factor that The present invention relates to static random access memories ("SRAMs"), and more particularly to SRAMs having circuits for altering a voltage level supplied thereto. In addition, aspects of the invention relate to methods of operating an SRAM in which a voltage level supplied thereto is altered.

SRAMs are uniquely suited to the functions they serve within processors and other devices for storage of data to which fast (low cycle time) and ready (low latency) access is desired. Certain types of storage within processors are almost always implemented using SRAMs, such as cache memories, control stores, buffer memories, instruction pipelines and data pipelines including input output interfaces and buffers for direct memory access ("DMA") interfaces. In addition, certain storage used for communication interfaces, e.g., network adapter buffers and so on, also utilize SRAMs for speed and low latency. Since SRAMs are frequently incorporated into chips on which other functions are implemented, e.g., processors (also referred to variously as microprocessors and central processing units ("CPUs")), they must perform at operating conditions as difficult as those that the processors must tolerate. In particular, SRAMs must perform within the same broad range of operating temperatures as processors and must be capable of tolerating fluctuations in supply voltages, e.g., noise disturbance, to the same extent as processors. Moreover, the sizes of SRAMs and SRAMs incorporated into chips having other functions are increasing. It is not uncommon for SRAMs to store many tens of millions of bits, even for SRAMs which are incorporated into other chips such as processors. In addition, to satisfy a growing demand for application specific integrated circuits ("ASICs"), it is desirable to provide SRAM macros ("macros" being functional modules) with large capacities capable of incorporation into multifunction chips, despite the scaling of the transistors and voltages used therein to unprecedented small sizes and values.

Storage cells in an SRAM or "SRAM cells" are arranged in an array of SRAM cells or "SRAM array." Wordlines ("WL") run in a direction of rows across an SRAM array. Bitlines run in a direction of columns across the SRAM array. Typically, one wordline WL is connected to each cell of a row of cells in the SRAM array. Typically, two bitlines carrying complementary signals are connected to each cell in a column of cells in the SRAM array, with one of the bitlines carrying a "true" signal representing the actual state of a bit signal and the other bitline carrying a "complementary" signal representing an inverted version of the bit signal.

As the size of each cell within the SRAM array decreases with later generations of SRAMs, the threshold voltage of field effect transistors ("FETs") used in each cell is subject to increased variability. In addition, the voltage level at which power is supplied to the SRAM array is reduced or "scaled" with the introduction of new generations of SRAMs.

The increased variability of the threshold voltage of the FETs of cells of an SRAM and the reduced power supply voltage level make it harder to guarantee that certain margins of error are maintained during operation of the SRAM. Such margins of error have a direct bearing on the SRAM's ability to maintain the integrity of the data stored therein. Clearly, there is a requirement that an extremely miniscule amount of such errors occur during operation of an SRAM. The maximum tolerable error or upper limit for such error is often measured in terms of a number of "sigma", sigma representing the standard deviation in a distribution curve representing the occurrence of such errors. As currently manufactured, SRAMs can have many millions of cells per SRAM array, the upper limit typically is set at one or two errors per the SRAM array. Stated another way, the maximum tolerable rate of error is set at a level such as one or two parts per billion, for example. This translates approximately to 5.2 sigma.

Margins of error which need to be maintained in the SRAM include access disturb margin ("ADM") and write margin ("WRM"). The state of a bit stored in a cell of an SRAM is more likely to undergo a spontaneous inversion when the SRAM cell is partially selected. Access disturb margin (ADM) is a measure of the likelihood that the state of a bit stored in a partially selected cell of the SRAM array will spontaneously change from one state to another, e.g., flip from a "high" to a "low" state when a cell of the SRAM is accessed during a read or write operation. An unselected SRAM cell is "half" selected when a wordline connected to that cell has been activated. In other words, a cell is half selected when another cell connected to the same wordline is accessed for either a read or a write operation. Such "half" selected cells are more susceptible to disturbance during access to the cells within the SRAM because such cells are frequently subject to potential disturbance during such accesses at times when they are not being accessed.

Another margin of error that must be satisfied is the ability to write the state of bit to an SRAM cell, given the strength of the bitline signals supplied to the SRAM cell and the time allotted to do so. Here, it is important that the SRAM cell have sufficient drive current to change from one stable state to another state under the influence of the bitline signals supplied thereto. If the SRAM cell fails to be written with the bit that is provided thereto, data integrity is impacted. WRM pertains to the occurrence of this type of error. Here again, it is important to reduce this type of error to an extremely miniscule amount. WRM, like ADM is typically measured in terms of standard deviations or "sigma" from a center of a distribution of the occurrence of error. As in the above case, WRM should preferably be maintained at a high sigma number, preferably at a sigma value of about 5.2 or more.

The scaling of one or more voltages supplied to each SRAM cell of the SRAM array for each succeeding generation of SRAMs only increases the difficulty of achieving a desired ADM and desired WRM. Various approaches have been suggested for providing high ADM, despite the scaling of the voltages. Increasing the threshold voltage of each n-type FET ("NFET") and p-type FET or ("PFET") helps improve ADM. However, such approach potentially worsens WRM. In an SRAM, the available amount of drive current within each SRAM cell is already limited because of the scaling of the voltage. As a result, raising the threshold voltages of the NFET and PFET make the NFET weaker and the PFET stronger. While the SRAM cell becomes more stable under such conditions, writing each SRAM cell becomes more difficult than before.

Moreover, whether or not the threshold voltage of the NFETs is raised or that of the PFETs is lowered, ADM and WRM tend to respond differently to temperature. The sigma value of ADM tends to be higher at lower temperatures, e.g., when a chip containing an SRAM is first turned on or when the chip is running at lower frequency. On the other hand, the sigma value of ADM becomes lower with increasing temperature. On the other hand, the sigma value of WRM tends to be lower at lower temperatures, and the sigma value of the WRM becomes higher with increasing temperature. As transistor sizes are scaled further downward in future generations of SRAMs, it becomes more difficult to achieve desirable sigma values on both ADM and WRM over the range of temperatures in which SRAMs (and processors which incorporate them) are required to operate.

Providing write schemes for SRAM cells having PFET passgates is one goal featured in commonly assigned U.S. Pat. No. 6,549,453 to Wong ("the '453 patent"). In one scheme described in the '453 patent, a voltage provided to a memory cell is adjusted from one level to another during a data writing operation to the memory cell. Circuits are provided by which a supply voltage provided to pull-up devices of the memory cell "floats down" to a lower level during the data writing operation. In addition, in one or more other schemes described therein, pull-down devices of the memory cell are disconnected from ground and allowed to "float up" to a voltage level higher than ground.

From the foregoing discussion, it is clear that new ways are needed to maintain high WRM and ADM in SRAMs despite further scaling of the transistors and voltages used in SRAM cells.

SUMMARY OF THE INVENTION

A design process including inputting a design file representing a circuit design embodied in a non-transitory computer-readable medium, and using a computer to translate the circuit design into a netlist. The netlist comprises a representation of a plurality of wires, transistors, and logic gates, and is stored in the non-transitory computer-readable medium. When executed by the computer, the netlist produces the circuit design. The circuit design comprises a static random access memory ("SRAM") including a plurality of SRAM cells arranged in an array The array includes a plurality of rows and a plurality of columns, and a plurality of column voltage control circuits corresponding to respective ones of the plurality of columns of the array. Each of the plurality of voltage control circuits is coupled to an output of a power supply. Each voltage control circuit is operable to temporarily reduce a voltage upon arrival of a bit select signal provided to power supply inputs of a plurality of SRAM cells belonging to a selected column of the plurality of columns. The selected column is selected during a write operation in which a bit is written to one of the plurality of SRAM cells belonging to the selected column. Each column voltage control circuit includes an n-type field effect transistor ("NFET") and a pair of p-type field effect transistors ("PFET") wherein one of the PFETs is configured such that its gate is connected to its drain. Each NFET and pair of PFETs has a conduction path directly connected between the output of the power supply and the power supply inputs of the plurality of SRAM cells.

DETAILED DESCRIPTION

Figure 1:
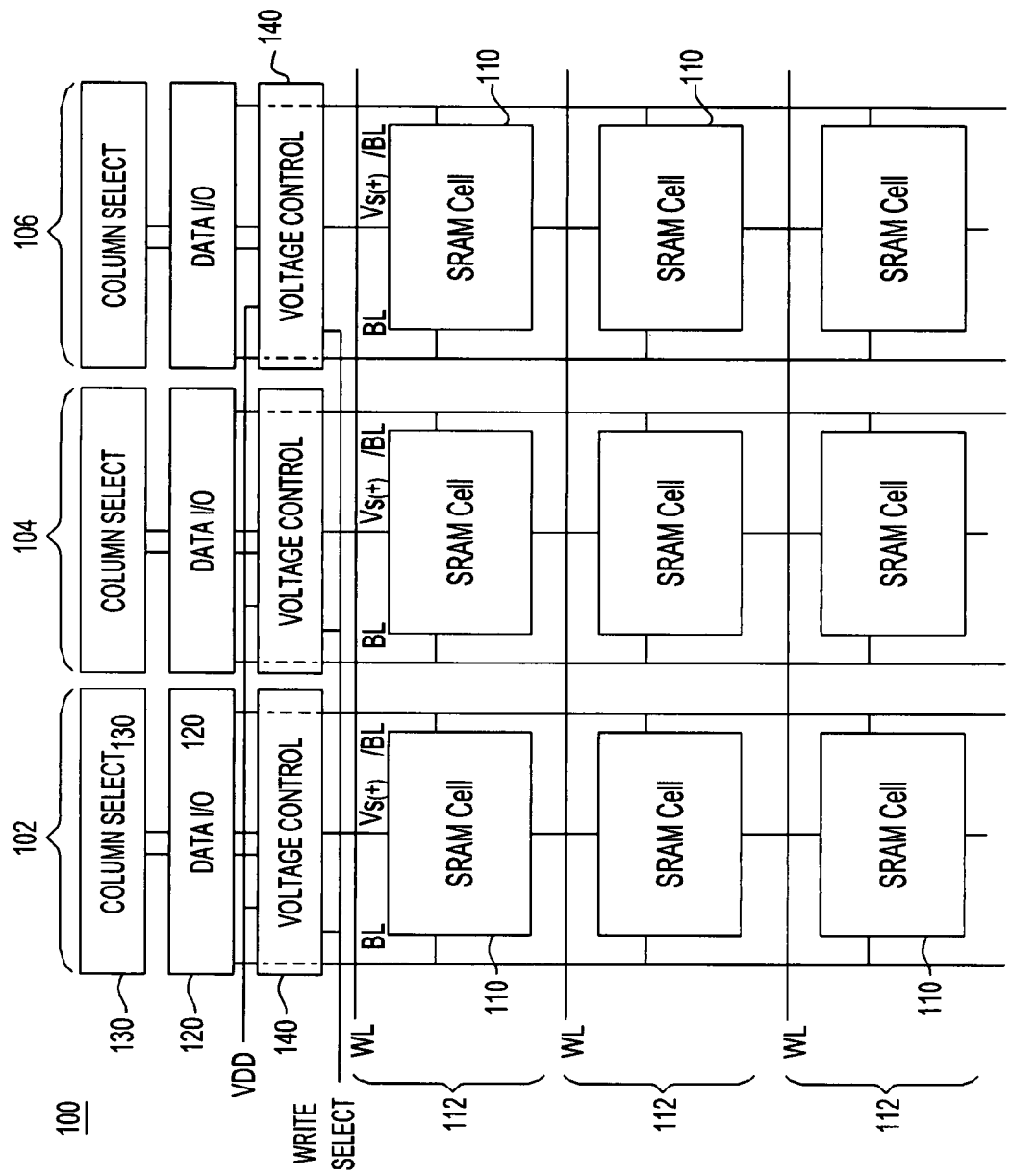
FIG. 1 is a block and schematic diagram illustrating an SRAM in accordance with an embodiment of the invention.

U.S. patent application Ser. No. 11/164,556 filed Nov. 29, 2005 to Wayne F. Ellis et al. entitled "SRAM Voltage Control for Improved Operational Margins" is incorporated by reference herein. FIG. 1 is a block and schematic diagram illustrating a static random access memory (SRAM) 100 in accordance with an embodiment of the invention. The SRAM 100 can be a stand-alone SRAM on a dedicated chip containing only one or more such SRAMs 100, or be incorporated into a chip having one or more additional functions, such as incorporated into a chip on which a processor or network interface is provided, for example.

As illustrated in FIG. 1, the SRAM includes a plurality of storage cells 110, each storage cell operable to store a data bit and to provide read access and write access thereto when power is supplied to the SRAM 100 during normal operation. The SRAM 100 typically includes many such cells, ranging from several thousand cells per SRAM to many millions of cells. Within the SRAM, storage cells are arranged in an array having a plurality of columns 102, 104, 106, etc., a plurality of rows 112, 114, 116, etc. For ease of illustration, only a few such cells 110 are shown.

The bitlines of the SRAM are arranged in a direction of the columns, two complementary bitlines BL and /BL being provided per each column of the array. One bitline (BL) is a "true" bitline which carries a signal representing the true or actual value of the data bit that is read from or written to one of the SRAM cells 110 coupled to that bitline. The other bitline (/BL) carries a signal representing the complement of the value of the data bit that is read from or written to one of the SRAM cells 110 coupled to that bitline. The wordlines WL of the SRAM are arranged in a direction of the rows, one wordline being provided for each row. The wordlines WL operate to provide read and write access to cells coupled to each wordline in a row of the SRAM.

Greatly simplified, the reading of data to the SRAM and writing of data from the SRAM is performed by changing the voltage of the wordline WL from an inactive level to an active level to provide access a row of cells within the SRAM, e.g., row 112. Then, when the operation is to read data stored in the SRAM, a data bit stored in one of the cells of the accessed row is transmitted as a signal along the complementary pair of bitlines BL, /BL coupled to the cell to the data input output ("I/O") unit 120 coupled to the pair of bitlines. When the operation is to write data to the SRAM, a data bit is transmitted as a signal from the data I/O unit 120 in a direction of an accessed column of cells along the complementary pair of bitlines BL, /BL to one of the cells that also belongs to the row of cells accessed by the wordline WL.

During a read operation, when the signal arrives at the data I/O unit 120, it usually is a small swing signal having a value, e.g., 15 to 30 millivolts (mV) which varies little from when the signal is inactive to when it is active. Illustratively, a sense amplifier in the data I/O unit 120 amplifies the small swing signal arriving thereto from the accessed cell to a rail-to-rail signal, i.e., one which has either a normal high logic level or a normal low logic level. In CMOS technologies of interest at the time of this application, a rail-to-rail signal swings from a high logic level of about 1 volt to a low logic level of ground. However, the embodiments of the invention herein are usable in SRAMs which have smaller or larger rail-to-rail signal swings than the 1 volt to ground example of a signal swing that is discussed here. In addition, while the low logic level is frequently set at ground, SRAMs exist in which the low logic level is set at a voltage other than ground. Unless otherwise specified, it is intended by way of the examples and embodiments described herein not to limit the nominal high and low logic levels used within the SRAM to any particular voltages or ranges of voltage.

During a write operation, a particular column of the SRAM is selected to be written through column select circuitry 130, as driven by column addressing signals provided thereto (not shown). Prior to performing the write operation, the voltage levels on both bitlines BL and /BL are set to the high logic level. During the write operation, typically the voltage on one of the bitlines BL and /BL of a column is lowered from the high logic level to the low logic level. Typically, a data bit value of zero is represented by a voltage of ground and a data bit value of one is represented by the high logic level, being illustratively 1 volt. Thus, illustratively, when a data bit value of zero is to be written, the voltage on the true bitline BL is lowered to ground. Conversely, when a data bit value of one is to be written, the voltage on the complementary bitline /BL is lowered to ground. An operation to write the SRAM cell is thus a process driven by the ground voltage level on one of the pair of bitlines.

As further shown in FIG. 1, the SRAM includes a voltage control unit 140, preferably occurring at a rate of one unit per column. The voltage control unit 140 raises and lowers the power supply voltage Vs(t) to each SRAM cell within a particular column as a function of time to permit a cell belonging such column to be written more easily. The voltage control unit 140 controls the level of the power supply voltage Vs(t) between a nominal level Vdd and a lowered level Vdda. The nominal level Vdd is a level at which power is normally provided to cells within the SRAM during read operations and to columns within the SRAM whenever those columns are not being written to at a particular time. The lowered level Vdda is a level at which power is provided to cells in a particular column of the SRAM when a cell belonging to such column is being written. Ordinarily, the lowered level Vdda will above 50% of the Vdd level. As a boundary condition, the lowered level Vdda should be at least slightly higher than the threshold voltage level of the NFET transistor in a cell of the SRAM. Preferably, the lowered level Vdda is a level of about 70% to 80% of the nominal level Vdd. As an illustrative example, when Vdd is about 1 volt, the lowered level Vdda can be a level such as 0.7 volt. In an exemplary embodiment, Vdda is lower than Vdd by an amount equal to the threshold voltage of a transistor used to vary the power supply voltage Vs(t) between the two levels.

When the power supply voltage Vs(t) is at the nominal level Vdd, greater protection is provided against the possibility of access disturbance, the above-described problem of spontaneous change in a stored bit value. However, the temporary reduction in the power supply voltage Vs(t) to the lowered level Vdda permits a cell of the accessed column of SRAM cells to be written more easily. This increases one's ability to write to the SRAM and improves write margin within the SRAM.

As further shown in FIG. 1, preferably, each column of the SRAM cells is served by a separate conductor 150 carrying a power supply voltage in a layout pattern referred to as "thin cell layout." In such layout, power supply conductors run along the middle of columns of SRAM cells. The placement of the power supply conductors in the middle of columns of SRAM cells allows the power supply voltage to individual columns to be lowered while minimizing the effects upon cells in neighboring columns of the SRAM. In particular, the placement of power supply conductors in the middle of the columns reduces or minimizes the coupling of noise to the cells of neighboring columns due to changes in the levels of the voltage supplied to individual columns.

Figure 2:
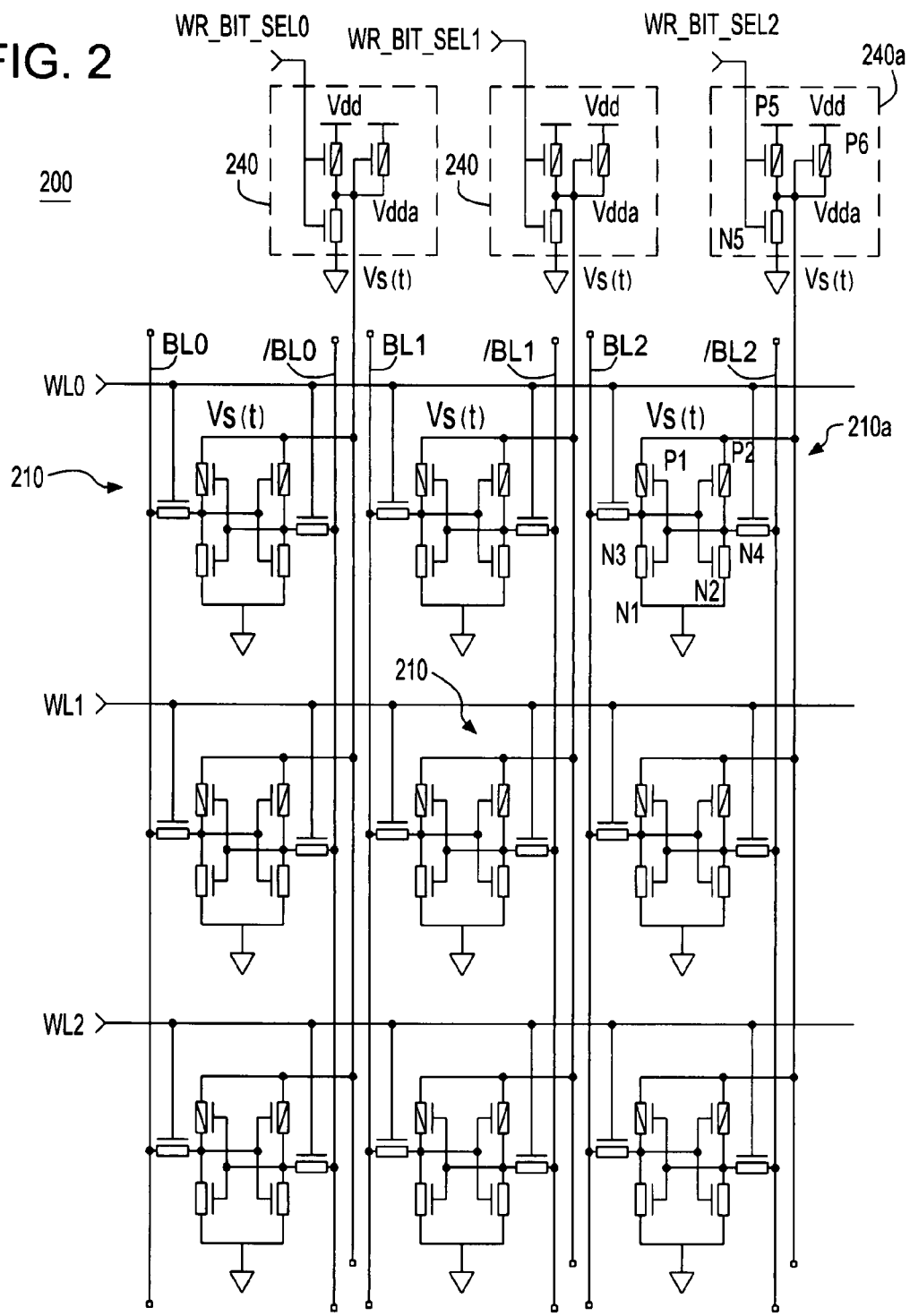
FIG. 2 is a schematic diagram further illustrating an SRAM in accordance with a particular embodiment of the invention.

FIG. 2 is a schematic diagram further illustrating an SRAM 200 according to a particular embodiment of the invention. The SRAM 200 is a particular example of the SRAM 100 described above with reference to FIG. 1 and operates in a manner like that of SRAM 100 described above. The structure and operation of SRAM 200 are described herein only to the extent as more particularly shown in FIG. 2 in relation to SRAM 100. As shown in FIG. 2, the SRAM 200 includes a plurality of individual storage cells 210. As above, only a few of the storage cells of the SRAM are shown in FIG. 2 for ease of illustration. Each storage cell, for example cell 210a, includes a latch and passgates. The latch includes a pair of cross-coupled inverters including a first inverter formed by PFET P1 and NFET N1, and a second inverter formed by PFET P2 and NFET N2. In each latch, the gate inputs of each inverter are connected to the common drain terminal of the other one of each inverter shown. In the particular example shown in FIG. 2, cell 210a and other cells 210 of the SRAM each include a pair of passgates implemented by NFETs N3 and N4.

Passgates N3 and N4 are activated by a high logic level voltage provided to the gate inputs of N3 and N4. When activated, the passgates N3 and N4 permit a bit to be read from or stored to a cell 210. Specifically, when activated, during a read operation the passgates couple bit signals from a cell 210 onto bitlines BL and /BL to be read by data I/O circuitry (FIG. 1). In addition, during a write operation, the passgates couple bit signals driven on bitlines BL and /BL by the data I/O circuitry to a cell 210 to write a data bit the cell 210.

The SRAM 200 further includes voltage control circuitry 240, preferably having a structure as shown particularly in FIG. 2. Preferably, the voltage control circuitry for each column of the SRAM 200 includes a first PFET P5, a second PFET P6 and an NFET N5. The gates of PFET P5 and NFET N5 are tied together and the drains of PFET P5 and NFET N5 are tied together as a common drain terminal. The gate and drain of PFET P6 are tied together so as to operate PFET P6 as a diode. The drain of PFET P6 is further tied to the common drain terminal of PFET P5 and NFET N5. A write bit select signal, e.g., signal WR_BIT_SEL2 is applied to the gates of PFET P5 and NFET N5.

Operation of the voltage control circuit 240 is as follows. During a read operation or during operation in which the SRAM is neither read from nor written to, the write bit select signals WR_BIT_SEL0, WR_BIT_SEL1, and WR_BIT_SEL2 are maintained at the low logic level, such as ground. One of these signals WR_BIT_SEL2 is applied to the gate of PFET P5 of the voltage control circuit 240a. This has the effect of fully turning on P5. At that time, the full power supply voltage level Vdd is passed through P5 from the power supply Vdd to the drain of P5. At such time, the full power supply voltage level Vdd also appears at the gate of PFET P6, such that P6 is turned off. In such case, the full power supply voltage level Vdd is passed through to cells of the column 202 served by the voltage control circuit 240a.

On the other hand, during a write operation, the write bit select signal WR_BIT_SEL2 to the voltage control circuit 240a is at a high logic level, having a high voltage signal above the threshold voltage of NFET N5. The high logic level of the write bit select signal is also above the threshold voltage of PFET P5, such that P5 is turned off at that time. At that time, NFET N5 and PFET P6 are also turned on. N5 functions as a pull-down device having an effect of quickly lowering the voltage at its drain from the Vdd level to a lower level. With the signal WR_BIT_SEL2 being high, P6 functions in a manner similar to a diode, producing a voltage drop approximately equivalent to its threshold voltage as a PFET.

The use of N5 as a pull-down device assures that the voltage control circuit 240a and other like voltage control circuits 240 transition the power supply voltage quickly when the voltage control circuit is selected by a write bit select signal at the high logic level. The pull-down device actively pulls down the power supply voltage Vs(t) present at the drain of N5 from Vdd to the lower Vdda level. In fact, in general, the circuit 240a transitions the power supply voltage from the nominal level Vdd to the lower level Vdda faster than in a circuit which has no such pull-down device connected to transistors P5 and P6. By lowering the power supply voltage Vs(t) quickly from Vdd to the lower level upon arrival of the WR_BIT_SEL2 signal, the circuit 240 applies the lower level of the power supply voltage Vs(t) at an earlier point in time to the cells of column 202. The lowered power supply voltage level Vs(t) and its early application to the cells of column 202 assure that a write operation to one of the cells along that column 202 is performed as early within the duty cycle of the write operation as possible.

Figure 3A:
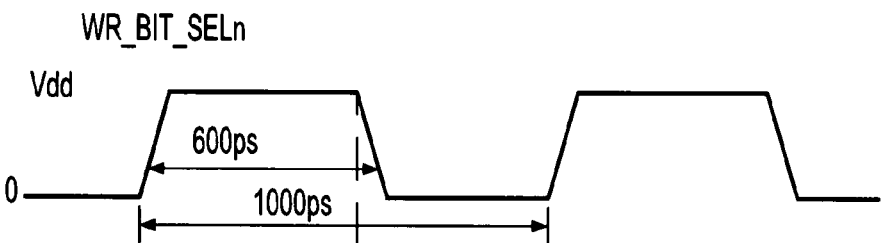
FIGS. 3(a) through 3(d) are timing diagrams illustrating operation of an SRAM in accordance with an embodiment of the invention.

FIGS. 3(a) through 3(d) are timing diagrams illustrating signals during a write operation to a cell 210a of an SRAM 200 according to the embodiment of the invention illustrated in FIG. 2. Signals are timed such that the power supply voltage Vs(t) is lowered to the accessed column prior to the activation of the wordline WL, thus assuring that conditions are at their most favorable for writing the cell beginning from the time that the wordline is activated. Some of the signals shown in FIGS. 3(a) through 3(d) transition at signal edges that coincide together, as described below. The time intervals shown in FIGS. 3(a) through 3(d) are illustrative of the duty cycles of the signals in relation to each other. In the illustrative example shown in FIGS. 3(a) through 3(d), the cycle time for performing one write access to the SRAM is 100 picoseconds ("ps"), i.e., 1 nanosecond ("ns"), Operation of the SRAM in accordance will now be explained with reference to the signals shown in FIGS. 3(a) through 3(d). FIG. 3(a) illustrates a write bit select signal WR_BIT_SELn. This signal activates one of the voltage control circuits 240 shown in FIG. 2, for example, the voltage control circuit 240a to lower the power supply voltage Vs(t) to a selected column of the SRAM. This signal is also used to select and activate one bitline (i.e., lower the voltage thereon to ground) of the pair of complementary bitlines of the selected column.

Figure 3B:
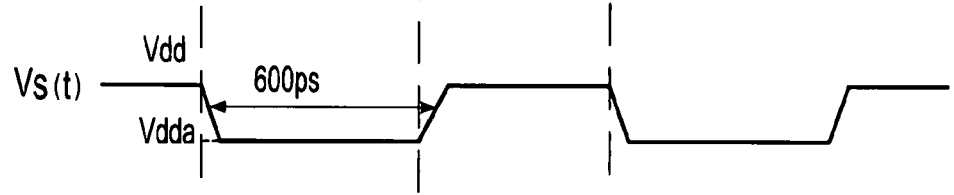

As seen in FIG. 3(b), the power supply voltage Vs(t) input to the column of SRAM cells falls from the higher steady-state level Vdd value to the lowered level Vdda in synchronism with the rise in the signal WR_BIT_SELn input to the voltage control circuit 240. At such time, NFET N5 of the voltage control circuit 240a (FIG. 2) actively pulls down the power supply voltage from Vdd to the lowered level Vdda, such level being determined by the threshold voltage of PFET P6 which is connected to function as a diode within the circuit 240a. In such manner, the power supply voltage Vs(t) readies the cell for writing when WR_BIT_SELn transitions from ground to the high Vdd level. In addition, referring to FIG. 3(c), in preparation for writing the data bit to the cell, the voltage level on one bitline of the pair of bitlines BL, /BL is also lowered from Vdd to ground at or about the same time that WR_BIT_SELn rises from ground to Vdd.

After the foregoing transitions have occurred: i.e., WR_BIT_SELn having transitioned to the active state, e.g., from ground to Vdd, the bitline signals adjusted to a value for writing a data bit to the cell, and the power supply voltage Vs(t) having been lowered to the lowered level Vdda, the wordline is activated. Conventionally, it is sought to increase the duty cycle of a wordline to be as long as possible within the cycle time for writing a data bit to a cell of the SRAM. This is done to allow time for signal current to flow between the cell through passgates of the cell to or from the bitlines, causing the latch of the cell to flip from one state to the other.

However, the state of a data bit stored in one cell of the SRAM cannot change until other conditions favor its immediate change. Here, conditions are not at their most favorable for changing the state of a bit stored in the SRAM until the power supply voltage level Vs(t) has fallen to the lowered level Vdda from the nominal level. In recognition thereof, in the embodiment of the invention illustrated in FIGS. 2 and 3(a) through 3(d), the duty cycle of the WR_BIT_SELn, the lowered voltage level Vdda, and the bitline write values are extended as long as possible. Then, the wordline is activated at the earliest time at which the foregoing signals can be considered to reach stable states following their transitions. In the particular example shown in FIGS. 3(a) through 3(d), the wordline is activated at a time of approximately 50 to 100 ps later, i.e., at a point in time which is approximately 5 to 10% of the cycle time later than the time at which the power supply voltage level Vs(t) and the bitlines begin to transition to their write values. In such manner, the wordline is activated at a time when it is most favorable to write a new data bit value to the accessed cell.

After the wordline is activated, it remains active for a period of time such as 500 ps, such duty cycle preferably being the maximum duty cycle permitted within the period of one writing cycle of the SRAM. In addition, such duty cycle is selected to assure that the power supply voltage Vs(t) has reached the lowered level Vdd and the signals on the bitlines are stable or at least near stable state. After the wordline is activated, current flows through the pass-gates of the cell between the cell and the bitlines coupled to the cell. Depending upon the value of the bit that was last previously stored in the cell and the value of the data bit being written, the state of the SRAM either stays the same or flips from the one state to the other state, i.e., from zero to one, or from one to zero.

Figure 3C:
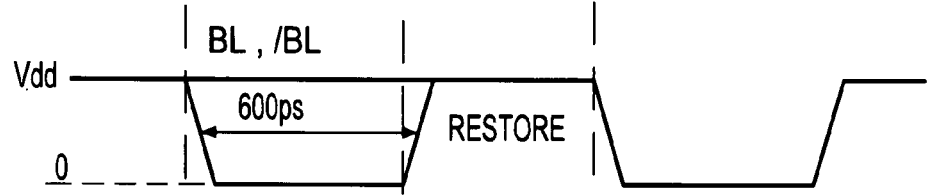
Figure 3D:
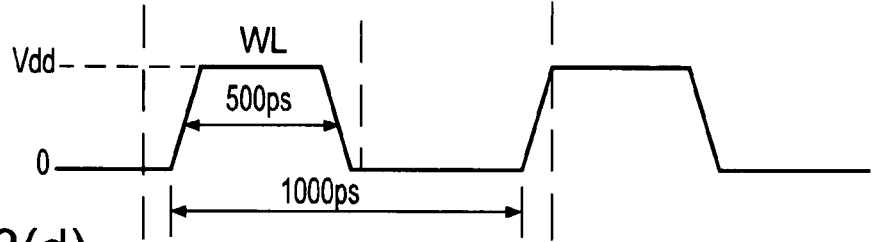

Thereafter, the after the bit has been written to the cell, the wordline is deactivated again. The write bit select signal WR_BIT_SELn returns to ground and the bitline signals are both restored to Vdd. The power supply voltage Vs(t) also returns to Vdd. Referring to FIG. 3(c), a precharge/restore interval ("RESTORE") then occurs.

Following the precharge/restore interval, when a cell is selected to be written again, a write bit select signal WR_BIT_SELn for the selected column is activated again, at which time the operations of lowering the power supply voltage Vs(t), lowering the voltage on one of the bitlines to a column occur, after which a wordline for a selected row is activated to write the data bit to the selected cell.

In a variation of the embodiment described with reference to FIGS. 3(a) through 3(d), logic circuitry may be employed to enhance the reliability of writing to cells of the SRAM when the SRAM is to be written continuously with data for a period of time extending over a plurality of cycles. As an example thereof, when data is to be written to a defined subset of the columns of the SRAM, WR_BIT_SELn is raised from ground to Vdd for the subset of columns and the power supply voltage Vs(t) is lowered for that subset of columns such that each of the columns is ready and primed to be written at that time. These signals are then left steady, unchanging at these active states for the whole time and for the number of cycles in which writing is performed continuously to the SRAM. Signals on bitlines are then altered in each cycle to write values, but only for the columns of the SRAM that are being written in each cycle. Corresponding wordlines of the SRAM are also activated in each cycle for the cells to be written in each cycle. Here, by leaving the write bit select signals and power supply voltages Vs(t) steady that are provided to each of many columns being written over a series of cycles, the power supply voltage has a greater measure of stability at the lowered level to such columns. In addition, a savings in current can be achieved for SRAMs in which the same column is accessed during multiple cycles having avoided transitioning the power supply voltage Vs(t) line to each column two or more times during the period that the SRAM is continuously written.

Figure 4:
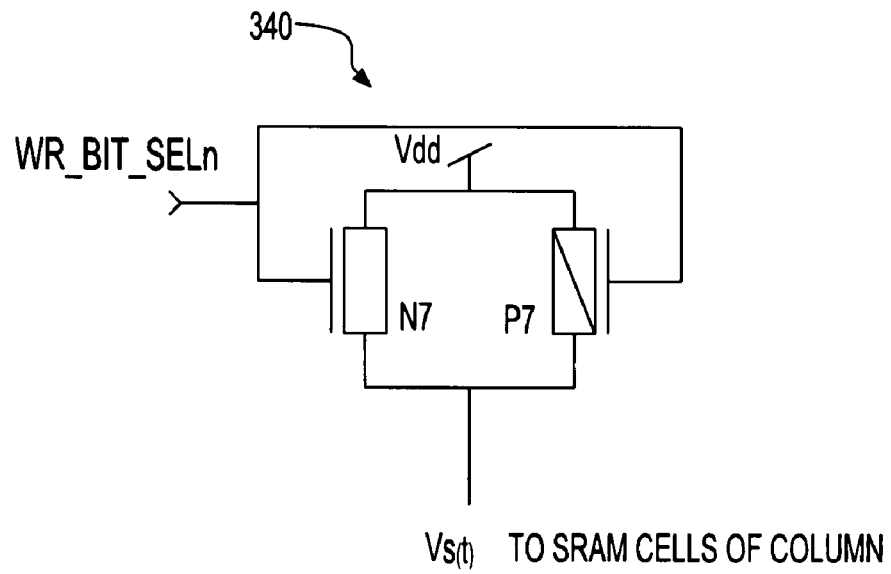
FIG. 4 is a schematic diagram illustrating an alternative voltage control circuit in accordance with a variation of the embodiment illustrated in FIG.

FIG. 4 illustrates a variation of the embodiment described above with reference to FIG. 2. As shown in FIG. 4, the voltage control circuit 340 includes an NFET N7 and PFET P7 connected in parallel, having an upper conductive terminal in which the drain of N7 and the source of P7 are connected directly to Vdd. The voltage control circuit 340 also has a lower conductive terminal connected to the source of N7 and the drain of P7 as the power supply voltage Vs(t) output from the voltage control circuit, such voltage being supplied to cells of a column of the SRAM. The write bit select signal WR_BIT_SELn is supplied in parallel to the gates of NFET N7 and PFET P7. In operation, when WR_BIT_SELn is at the deselected state of ground, N7 is turned off and P7 is turned on. At another time, when WR_BIT_SELn is at the selected state of Vdd, N7 is turned on and P7 is turned off. At such time, the lowered level Vdda of the power supply voltage Vs(t) is lower than the nominal level Vdd by the value of the threshold voltage of NFET N7.

Figure 5:
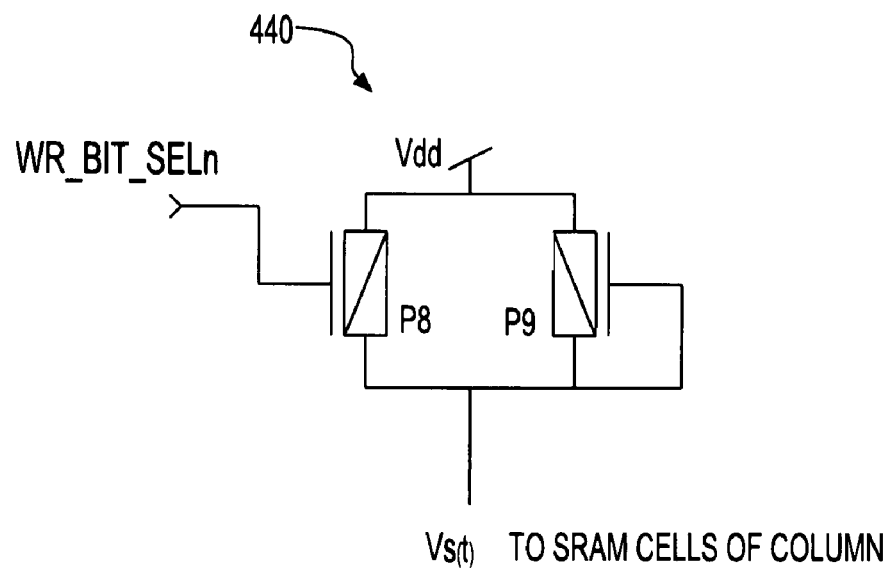
FIG. 5 is a schematic diagram illustrating a further alternative voltage control circuit in accordance with another variation of the embodiment illustrated in FIG. 1.

FIG. 5 illustrates another variation of the embodiment described above with reference to FIG. 2. As shown in FIG. 5, the voltage control circuit 440 includes a first PFET P8 and a second PFET P9 connected in parallel, in which the sources of P8 and P9 are connected directly to Vdd. The voltage control circuit 440 also has a lower conductive terminal connected to the drains of P8 and P9 as the power supply voltage Vs(t) output from the voltage control circuit, such voltage being supplied to cells of a column of the SRAM. In circuit 440, the write bit select signal WR_BIT_SELn is supplied to the gate of PFET P8. The gate of PFET P9 is connected to its drain such that P9 operates as a diode when it is biased in a turned on state. In operation, when WR_BIT_SELn is at the deselected state of ground, P8 is turned on and P9 is biased in the off state such that Vdd is passed through P8 as the power supply voltage Vs(t). At another time, when WR_BIT_SELn is at the selected state of Vdd, P8 is turned off. At that time P9 is turned on but operates as a diode such that the voltage at the drain of P9 is lower than Vdd by the threshold voltage of P9. At such time, the power supply voltage Vs(t) has the lowered level Vdda, lower than the nominal level Vdd by the value of the threshold voltage of P9.

By the foregoing embodiments, ways are provided to improve write margin (WRM) within an SRAM or other like memory without adversely affecting access disturb margin (ADM). Moreover, ways are provided to lower the power supply voltage to cells of the SRAM and then time the activation of the wordline for the greatest success in writing the SRAM within the limited cycle time of the SRAM.

Figure 6:
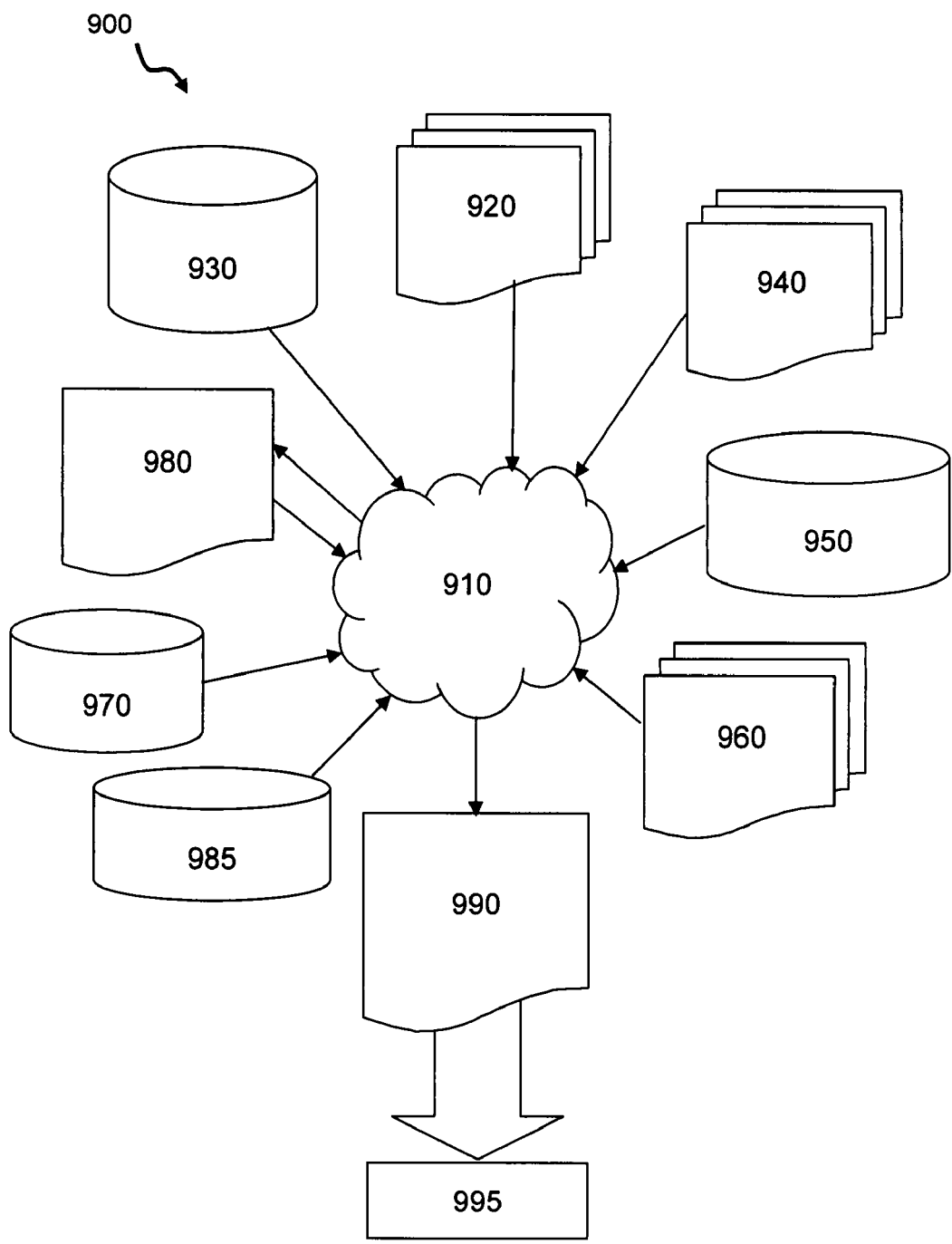
FIG. 6 is a block diagram of an exemplary design flow such as can be used in fabrication of a design structure in accordance with an embodiment of the present invention.

FIG. 6 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises a static random access memory (SRAM) 100 (FIG. 1) in the form of schematics or HDL, a hardware-description language (e.g., Verilog, VHDL, C, etc.). Design structure 920 may be contained on one or more machine readable medium. For example, design structure 920 may be a text file or a graphical representation of SRAM 100. Design process 910 preferably synthesizes (or translates) SRAM 100 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in [fill in figure or figures that represent the design], along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-5. Design structure 990 may then proceed to a stage 995 where, for example, design structure 990: proceeds to tape-out, is released to manufacturing, is released to a mask house, is sent to another design house, is sent back to the customer, etc.

While the invention has been described in accordance with certain preferred embodiments thereof, many modifications and enhancements can be made thereto without departing from the true scope and spirit of the invention, which is limited only by the claims appended below.

What is claimed is:

1. A design process including inputting a design file representing a circuit design embodied in a non-transitory computer-readable medium, using a computer to translate the circuit design into a netlist, wherein the netlist comprises a representation of a plurality of wires, transistors, and logic gates, and wherein the netlist is stored in the non-transitory computer-readable medium; and when executed by the computer, produces the circuit design comprising:

a static random access memory ("SRAM"), including a plurality of SRAM cells arranged in an array, said array including a plurality of rows and a plurality of columns; and a plurality of column voltage control circuits corresponding to respective ones of said plurality of columns of said array, each of said plurality of voltage control circuits coupled to an output of a power supply, each said voltage control circuit being operable to temporarily reduce a voltage upon arrival of a bit select signal provided to power supply inputs of a plurality of SRAM cells belonging to a selected column of said plurality of columns, said selected column being selected during a write operation in which a bit is written to one of said plurality of SRAM cells belonging to said selected column, wherein each said column voltage control circuit includes an n-type field effect transistor ("NFET") and a pair of p-type field effect transistors ("PFET") wherein one of the PFETs is configured such that its gate is connected to its drain, each of said NFET and said pair of PFETs having a conduction path directly connected between the output of the power supply and said power supply inputs of said plurality of SRAM cells.

2. The design process as claimed in claim 1, wherein the SRAM further comprises a plurality of power supply conductors, each running along a middle of a respective one of said plurality of columns of said array, each of said plurality of power supply conductors connecting one of said plurality of voltage control circuits to said power supply inputs of said plurality of cells of an individual one of said plurality of columns.

* * * * *